(12) United States Patent
Tetsuka (10) Patent No.: US 9,090,826 B2
(45) Date of Patent: *Jul. 28, 2015

(54) LIGHT EMITTING BODY

(75) Inventor: Hiroyuki Tetsuka, Aichi-Gun (JP)

(73) Assignee: KABUSHIKI KAISHA TOYOTA CHUO KENKYUSHO, Nagakute-shi (JP)

(*) Notice: Subject to any disclaimer, the term of this patent is extended or adjusted under 35 U.S.C. 154(b) by 0 days.

This patent is subject to a terminal disclaimer.

(21) Appl. No.: 13/824,830

(22) PCT Filed: Aug. 24, 2011

(86) PCT No.: PCT/JP2011/069034
§ 371 (c)(1),
(2), (4) Date: Mar. 18, 2013

(87) PCT Pub. No.: WO2012/086261
PCT Pub. Date: Jun. 28, 2012

(65) Prior Publication Data
US 2013/0181166 A1 Jul. 18, 2013

(30) Foreign Application Priority Data

Dec. 24, 2010 (JP) ................................. 2010-288068
Jul. 25, 2011 (JP) ................................. 2011-162621

(51) Int. Cl.
| | |
|---|---|
| C09K 11/06 | (2006.01) |
| C09K 11/65 | (2006.01) |
| C01B 31/04 | (2006.01) |
| H01L 33/02 | (2010.01) |
| H01L 33/34 | (2010.01) |
| B82Y 30/00 | (2011.01) |
| B82Y 40/00 | (2011.01) |

(52) U.S. Cl.
CPC ................ *C09K 11/65* (2013.01); *B82Y 30/00* (2013.01); *B82Y 40/00* (2013.01); *C01B 31/0476* (2013.01); *C09K 11/06* (2013.01); *H01L 33/02* (2013.01); *H01L 33/34* (2013.01); *C01B 2204/04* (2013.01); *C01B 2204/20* (2013.01); *C01B 2204/30* (2013.01); *C09K 2211/1416* (2013.01)

(58) Field of Classification Search
None
See application file for complete search history.

(56) References Cited

U.S. PATENT DOCUMENTS

| | | | | |
|---|---|---|---|---|
| 6,329,083 | B1* | 12/2001 | Toguchi et al. | 428/690 |
| 6,465,116 | B1* | 10/2002 | Ishikawa et al. | 428/690 |
| 2005/0106415 | A1* | 5/2005 | Jarikov et al. | 428/690 |
| 2007/0216292 | A1* | 9/2007 | Seo et al. | 313/506 |
| 2010/0237296 | A1 | 9/2010 | Gilje | |
| 2010/0301279 | A1 | 12/2010 | Nesper et al. | |
| 2011/0049437 | A1 | 3/2011 | Crain et al. | |
| 2013/0181165 | A1* | 7/2013 | Tetsuka et al. | 252/301.16 |
| 2014/0212668 | A1* | 7/2014 | Dichtel et al. | 428/402 |

FOREIGN PATENT DOCUMENTS

| | | |
|---|---|---|
| CN | 101818059 A | 9/2010 |
| JP | A-2010-173886 | 8/2010 |
| JP | A-2010-222245 | 10/2010 |
| JP | A-2010-232511 | 10/2010 |
| JP | A-2010-275186 | 12/2010 |
| WO | WO 2009/049375 A1 | 4/2009 |
| WO | WO 2009/123771 A2 | 10/2009 |

OTHER PUBLICATIONS

U.S. Appl. No. 61/479,998, filed Apr. 28, 2011.*
Pan et al., "Hydrothermal Route for Cutting Graphene Sheets into Blue-Luminescent Graphene Quantum Dots," *Adv. Mater.*, 2010, vol. 22, pp. 734-738.
Eda et al., "Blue Photoluminescence from Chemically Derived Graphene Oxide," *Adv. Mater.*, 2010, vol. 22, pp. 505-509.
Mueller et al., "Triplet States and Electronic Relaxation in Photoexcited Graphene Quantum Dots," *Nano. Lett.*, 2010, vol. 10, 2679-2682.
Pan et al., "Hydrothermal Route for Cutting Graphene Sheets into Blue-Luminescent Graphene Quantum Dots," *Adv. Mater.* 2009, vol. 21, pp. 1-5.
International Search Report issued in International Patent Application No. PCT/JP2011/069034 mailed Nov. 29, 2011.
Written Opinion of the International Searching Authority issued in International Patent Application No. PCT/JP2011/069034 mailed Nov. 29, 2011 (with partial translation).
International Preliminary Report on Patentability issued in International Patent Application No. PCT/JP2011/069034 mailed Apr. 4, 2013 (with translation).
Japanese Office Action for Application No. 2010-288068 mailed Aug. 13, 2013 (with English Translation).

(Continued)

*Primary Examiner* — Marie R. Yamnitzky
(74) *Attorney, Agent, or Firm* — Oliff PLC (57) ABSTRACT

A light emitting body has a base material containing a graphene structure and a covering material for covering a surface of the base material. The graphene structure preferably includes a sheet portion made of a monolayer or multilayer graphene nanosheet and having, at an edge portion thereof, an armchair edge-face portion; and a terminal six-membered ring bound to the armchair edge-face portion while sharing only one side therewith. Further, the graphene structure preferably includes a nitrogen-containing functional group bound to any one or more carbon atoms selected from (a) carbon atoms constituting the terminal six-membered ring but not bound to the armchair edge-face portion, and (b) carbon atoms constituting the sheet portion (including carbon atom on the side shared with the terminal six-membered ring).

5 Claims, 2 Drawing Sheets

(56) References Cited

OTHER PUBLICATIONS

Wang et al., "Synthesis and characterisation of hydrophilic and organophilic graphene nanosheets," *Carbon*, 2009, pp. 1359-1364, vol. 47, Elsevier Ltd.

Dec. 6, 2011 International Search Report issued in International Application No. PCT/JP2011/069033.

Jan. 8, 2013 English language translation of the International Preliminary Report on Patentability issued in International Application No. PCT/JP2011/069033.

Jan. 29, 2014 Office Action issued in U.S. Appl. No. 13/824,851.

Dec. 18, 2013 Office Action issued in Japanese Patent Application No. 2010-288067 (with translation).

Yang et al., "Graphene in Mice: Ultrahigh In Vivo Tumor Uptake and Efficient Photothermal Therapy", Nano Letters, Aug. 4, 2010, vol. 10, pp. 3318-3323.

May 2, 2014 Office Action issued in U.S. Appl. No. 13/824,851.

May 27, 2014 Office Action issued in Japanese Patent Application No. 2011-139963 w/translation.

Tetsuka et al., "Optically Tunable Amino-Functionalized Graphene Quantum Dots," Advanced Materials, 2012, 24, pp. 5333-5338.

Tian et al., "Tailoring surface groups of carbon quantum dots to improve photoluminescence behaviors," Applied Surface Science, 2014, 301, pp. 156-160.

Radovic et al., "On the Chemical Nature of Graphene Edges: Origin of Stability and Potential for magnetism in Carbon Materials," J. Am. Chem. Soc., 2005, 127, pp. 5917-5927.

Peng et al., "Graphene Quantum Dots Derived from Carbon Fibers," Nano Letters, 2012, 12, pp. 844-849.

Oct. 3, 2014 Office Action issued in U.S. Appl. No. 13/824,851.

May 15, 2015 European Search Report issued in European Application No. 11850954.6.

Long et al., "Preparation of Nitrogen-Doped Graphene Sheets by a Combined Chemical and Hydrothermal Reduction of Graphene Oxide", LANGMUIR, vol. 26, No. 20, Oct. 19, 2010, pp. 16096-16102.

Janowska et al., "Microwave Synthesis of Large Few-Layer Graphene Sheets In Aqueous Solution Of Ammonia", Nano Research, vol. 3, No. 2, Feb. 1, 2010, pp. 126-137.

Li D et al., "Processable Aqueous Dispersions of Graphene Nanosheets", Nature Nanotechnology, Nature Publishing Group, London, GB, vol. 3, No. 2, Feb. 1, 2008, pp. 101-105.

Li X et al., "Simultaneous Nitrogen Doping and Reduction of Graphene Oxide", Journal of the American Chemical Society, vol. 131, No. 43, Nov. 4, 2009, pp. 15939-15944.

\* cited by examiner

LIGHT EMITTING BODY

FIELD OF THE INVENTION

The present invention relates to a light emitting body, more specifically, a novel light emitting body which can be used for probes for detecting a biochemical reaction, light emitting devices, LEDs, displays, fluorescent tags, and the like.

BACKGROUND OF THE INVENTION

The term "light emitting body" as used herein means a substance which absorbs light of a certain wavelength to excite electrons and emits light (fluorescence, phosphorescence) when the electrons thus excited fall back to the ground state.

Among the light emitting bodies, the followings are known as phosphors which emit fluorescence:

(1) inorganic phosphors composed mainly of an oxide, a nitride, a sulfide, or the like and doped with ions serving as an emission center, (2) organic phosphors such as rare earth complexes, and (3) carbon phosphors such as carbon nanoparticles and graphene nanosheets.

Of these, graphene-based carbon phosphors are characterized in that they are excellent in electrical properties, thermal properties, and mechanical properties and in addition, are chemically stable.

There have conventionally been a variety of proposals on such phosphors made of a graphene-based material.

For example, Non-patent Document 1 discloses graphene quantum dots (GQDs) available by:

(1) using, as a starting raw material, micrometer-sized rippled graphene nanosheets (GSs) available by thermal reduction of graphene oxide (GO), (2) oxidizing the GSs in highly concentrated $H_2SO_4$ and $HNO_3$ to introduce, at the edge and on the basal plane, an oxygen-containing functional group such as C=O/COOH, OH, and C—O—C, (3) subjecting the oxidized GSs to hydrothermal treatment at 200° C., and (4) filtering and dialyzing the resulting colloid solution.

This document describes that:

(a) deoxidization occurs due to the hydrothermal treatment and the (002) spacing of the GQDs was reduced and became close to that of bulk graphite, (b) the size of the GSs decreased dramatically by the hydrothermal treatment and ultrafine GQDs (average diameter: 9.6 nm) can be isolated by a dialysis process, (c) the oxidized GSs show no detectable photoluminescence (PL) behavior, while the GQDs emit bright blue luminescence even in neutral media, (d) the GQDs shows a PL spectrum with a strong peak at 430 nm on excitation at the absorption band of 320 m, and (e) The PL quantum yield of the GQDs is 6.9%, comparable with those of luminescent carbon nanoparticles.

Non-patent Document 2 discloses GO thin films reduced with hydrazine vapor.

This document describes that:

(a) the PL characteristics of the GO originate from the recombination of electron-hole (e-h) pairs localized within small $sp^2$ carbon clusters embedded within an $sp^3$ matrix, (b) the absorbance of the GO increases with hydrazine exposure time, consistent with the evolution of oxygen (from ~39 at % in starting GO to 7~8 at % in the reduced GO), (c) the PL peak position of the GO thin films does not undergo a large change when subjected to reduction treatment and is centered around 390 nm, and (d) while the PL intensity of the GO thin films is weak for as-deposited GO films, short exposure to hydrazine vapor results in a dramatic increase in the PL intensities.

Further, Non-patent Document 3 discloses graphene quantum dots which have been synthesized through solution chemistry, contain 132 conjugated carbon atoms, and at the same time are enclosed in all three dimensions by three solubilizing 2',4',6'-trialkyl phenyl groups.

This document describes that:

(a) the graphene is stable in various organic solvents without aggregation, (b) when this graphene is dispersed in toluene and excited at 510 nm at room temperature, emission peaks appear at 670 nm and 740 nm, (c) the emission at 740 nm is phosphorescence and the time dependent behavior of it shows a single exponential decay with a time constant of 4 µs at room temperature, and (d) the emission at 670 nm is fluorescence and the dynamics of it can be fitted with a biexponential decay with time constants of 5.4 and 1.7 ns.

Carbon phosphors using a graphene nanosheet as a base emit blue luminescence as described in Non-patent Documents 1 and 2. It is known that some of conventional phosphors contain a harmful element such as cadmium, but carbon phosphors do not require such a harmful element in order to achieve PL characteristics.

Carbon phosphors available by the conventional methods, however, have a markedly short emission lifetime as described in Non-patent Document 3. The emission efficiency of carbon phosphors so far reported is 6.9% at the maximum as described in Non-patent Document 1.

CITATION LIST

Non-Patent Documents

[Non-patent Document 1] D. Pan et al., Adv. Mater. 2010, 22, 734-738

[Non-patent Document 2] G. Eda et al., Adv. Mater. 2010, 22, 505-509

[Non-patent Document 3] M. L. Mueller et al., Nano Lett. 2010, 10, 2679-2682

SUMMARY OF THE INVENTION

A problem that the invention is to solve is to provide a novel light emitting body having a relatively long emission lifetime.

Another problem that the invention is to solve is to provide a novel light emitting body showing relatively high emission efficiency.

With a view to overcoming the above-mentioned problems, the light emitting body according to the invention has:

a base material containing a graphene structure; and a covering material for covering a surface of the base material.

The graphene structure preferably includes:

a sheet portion composed of a monolayer or multilayer graphene nanosheet and having, at an edge portion of the sheet, an armchair edge-face portion; and a terminal six-membered ring bound to the armchair edge-face portion while sharing only one side therewith.

The graphene structure is preferably further includes a nitrogen-containing functional group bound to any one or more carbon atoms selected from:

(a) carbon atoms constituting the terminal six-membered ring but not bound to the armchair edge-face portion, and (b) carbon atoms constituting the sheet portion (including carbon atom on the side shared with the terminal six-membered ring).

Covering of the surface of the base material containing the graphene structure extends the emission lifetime, which is presumed to occur because:

(1) rotational motion or vibrational motion of the functional group in a covering material enhances the spin-orbit interaction of the graphene structure and causes intersystem crossing to an excited level different in spin multiplicity;

(2) a hydrogen bond formed between the covering material and the base material suppresses quenching due to the reaction between the triplet excited state of the graphene structure and dissolved oxygen; or (3) a σ-π electron pair formed in the edge structure of the graphene structure enhances the spin-orbit interaction, causing intersystem crossing to excited levels different in spin multiplicity.

Moreover, introduction of nitrogen into the graphene structure increases the emission efficiency further, which is presumed to occur because nitrogen introduced into the structure suppresses nonradiative recombination.

DETAILED DESCRIPTION OF THE PREFERRED EMBODIMENTS

One embodiment of the invention will hereinafter be described specifically.

[1. Light Emitting Body (1)]

The light emitting body according to the first embodiment of the invention is equipped with a base material containing a graphene structure and a covering material. The graphene structure can be obtained, as will be described later, by dispersing graphite oxide and/or graphene oxide in water or an aqueous solution having a nitrogen-containing compound dissolved therein and heating the resulting dispersion at 60° C. or greater.

[1.1. Base Material]

In the present embodiment, the term "base material" means a base material containing a graphene structure. The base material may be either a material made of a graphene structure (graphene structure in the narrow sense) not containing nitrogen or a material made of a graphene structure containing nitrogen further (nitrogen-containing graphene structure). The base material may be comprised only of either one of a monolayer or multilayer graphene structure in the narrow sense or a monolayer or multilayer nitrogen-containing graphene structure or it may be a mixture of two or more of them.

[1.1.1. Graphene Structure]

In the present embodiment, the term "graphene structure" means a graphene structure comprised of a monolayer or multilayer graphene nanosheet.

In the present embodiment, the term "graphene nanosheet" means a graphene nanosheet having at least partially a two-dimensional layered structure made of carbon atoms and further containing, in the main portion in the layer surface thereof, a carbon ring structure and an ($sp^2$ bonded) aromatic ring. The graphene nanosheet may contain less than 0.5 wt % nitrogen as an unavoidable impurity (graphene nanosheet in the narrow sense) or may contain 0.5 wt % or more nitrogen (nitrogen-containing graphene nanosheet).

In order to exhibit PL characteristics, it is presumed that the graphene nanosheet is required to have, in an insulating matrix ($sp^3$ matrix) comprised of carbon atoms having an $sp^3$ hybrid orbital, a structure in which fine clusters ($sp^2$ clusters) made of carbon atoms having an $sp^2$ hybrid orbital have been embedded. In other words, in the graphene nanosheet exhibiting PL characteristics, $sp^2$ clusters are presumed to function as an emission center.

[1.1.2. Nitrogen-Containing Graphene Structure]

In the present embodiment, the term "nitrogen-containing graphene structure" means a structure obtained by intentionally introducing nitrogen into a graphene structure in the narrow sense which is made of a monolayer or multilayer graphene nanosheet and as a result, having a nitrogen content of 0.5 wt % or greater.

In the present embodiment, the term "introducing nitrogen" means, (1) substituting some of the carbon atoms constituting the graphene nanosheet with nitrogen, (2) bonding a nitrogen-containing functional group onto the edge and/or basal plane of the graphene nanosheet, or (3) adsorbing a nitrogen-containing compound to the surface of the graphene nanosheet or between two nanosheets.

The nitrogen introduced into the graphene nanosheet may be present in any one form of substitution, bonding, or adsorption or may be present in any two or more forms of them.

In the present embodiment, the term "nitrogen-containing functional group" means a functional group containing nitrogen as a constituting element. Examples of the nitrogen-containing functional group include amino group, imino group, N-oxide group, N-hydroxy group, hydrazine group, nitro group, nitroso group, azo group, diazo group, and azide group.

In the nitrogen-containing graphene structure, any one of these nitrogen-containing functional groups may be bound to the graphene nanosheet or two or more of them may be bound thereto.

In the present embodiment, the term "nitrogen-containing compound" means a compound containing nitrogen as a constituting element and soluble or dispersible in water. Examples of the nitrogen-containing compound include (1) urea, ammonia, thiourea, hydrazine, nitrate esters, sodium nitrate, sodium nitrite, hydroxylamine, pyridine N-oxide, N-hydroxyalkyleneimine, sodium azide, sodium amide, and carboxylic acid azide;

(2) alkylamines such as methylamine, ethylamine, n-propylamine, isopropyl amine, n-butylamine, tert-butylamine, n-pentylamine, and n-hexylamine and halates thereof, and (3) diamines such as ethylenediamine and propanediamine.

In the nitrogen-containing graphene structure, any one of these nitrogen-containing compounds may have adsorbed to the graphene nanosheet or any two or more of them may have adsorbed thereto.

[1.1.3. Nitrogen Content]

The nitrogen content in the base material has an influence on the emission efficiency and emission wavelength.

In the invention, the base material is not always required to contain nitrogen, but with an increase in the nitrogen content, both the emission efficiency and a change in emission wavelength are enhanced. In order to achieve such an effect, the nitrogen content is preferably 0.5 wt % or greater. The nitrogen content is more preferably 1 wt % or greater, still more preferably 2 wt % or greater, still more preferably 5 wt % or greater.

On the other hand, when the nitrogen content increases excessively, the electron state undergoes a drastic change and PL characteristics cannot be achieved. The nitrogen content is therefore preferably 50 wt % or less. The nitrogen content is more preferably 40 wt % or less, still more preferably 30 wt % or less, still more preferably 20 wt % or less, still more preferably 10 wt % or less.

[1.1.4. Average Thickness]

The thickness of the base material (that is, the number of stacked layers of sheet) has an influence on the emission efficiency and emission wavelength.

Even if the base material has a monolayer graphene structure, it functions as a light emitting body. The thickness of the monolayer graphene nanosheet is about 0.3 nm, which means that the base material may have at least an average thickness of 0.3 nm or greater.

With an increase in the thickness of the base material, the emission wavelength becomes longer, which is presumed to occur because the $\pi$-$\pi$* energy gap decreases with an increase in the size of $sp^2$ clusters in the sheet stacking direction.

When the base material becomes excessively thick, however, the electron structure approximates to that of the bulk, making it impossible to achieve efficient light emission. The average thickness of the base materials is preferably 50 nm or less. The average thickness is more preferably 20 nm or less, still more preferably 10 nm or less, still more preferably 5 nm or less.

The term "average thickness of the base material" means an average thickness of n pieces (n≥5) of the base materials selected at random.

Examples of a method for measuring the thickness include:
(1) a method of measuring the thickness of the sheet directly by using an atomic force microscope (AFM); and
(2) a method of determining the thickness while considering an ideal thickness (0.34 nm) corresponding to one layer from the layer number of the sheet observed from a transmission electron microscope (TEM) photograph. Almost the same measurement results can be obtained by using either method.

[1.1.5. Average Size]

The size of the base material has an influence on the emission efficiency and emission wavelength.

In general, with a decrease in the size of the base material, the emission efficiency increases due to a quantum size effect, but the emission wavelength decreases. In order to achieve light emission in a visible light range, the average size of the base material is preferably 1 nm or greater. The average size is more preferably 2 nm or greater, still more preferably 3 nm or greater.

On the other hand, when the base material has an excessively large size, so-called "quenching" occurs, that is, re-absorption, to the sheet, of fluorescence emitted from the emission center, leading to a decrease in emission efficiency. The average size of the base material is therefore preferably 1000 nm or less. The average size is more preferably 500 nm or less, still more preferably 100 nm or less.

The term "average size of the base material" as used herein means an average size of n pieces (n≥5) of the base materials selected at random.

The term "size of the base material" means a long diameter (length in the direction giving the maximum length) of the sheet plane.

[1.2. Covering Material]

The surface of the base material has been covered with a covering material. The covering material may cover the whole surface of the base material or a part of the surface of the base material.

In the present embodiment, the term "covering material" means a compound having a polar group and at the same time, not having a $\pi$ conjugated bond. The nitrogen-free graphene structure is hydrophilic and dispersible well in water. This will equally apply to a nitrogen-containing graphene structure containing a proper amount of nitrogen. Since the covering material having a polar group and the hydrophilic sheet have affinity with each other, they are easily bound to each other to form a composite when mixed in a polar solvent.

No particular limitation is imposed on the molecular weight of the covering material. The covering material may be any of a low molecular weight compound having a molecular weight less than 1000, an oligomer having a molecular weight of 1000 or greater but less than 10000, or a polymer having a molecular weight of 10000 or greater.

Specific examples of the covering material include:
(1) ε-caprolactam,
(2) polyacrylic acid resins, cellulose-based resins, polyvinyl resins, polyurethane resins, methacrylic resins, polyester resins, silicone resins, polyethylene glycol, polyimide resins, polycarbonate, polyethylene oxide, and polyamide resins; and
(3) silane and silane compounds.

These covering materials may be used either singly or in combination.

[1.3. Amount of Covering Material]

The amount of the covering material has an influence on the emission lifetime.

In general, with an increase in the amount of the covering material, the emission life extends. On the other hand, covering with an excess amount of the covering material does not bring practical benefit because its effect is saturated. The optimum amount of the covering material is selected, depending on the kind of the base material and the kind of the covering material. The amount of the covering material is typically from 0.01 to 99.9 wt %.

[1.4. Emission Lifetime]

The light emitting body according to the present embodiment has a longer emission lifetime than a phosphor using the conventional graphene as a base. The light emitting body having an optimized average thickness, average size, nitrogen content, or the like has an emission lifetime of 10 ns or greater or 100 ns or greater.

The term "emission lifetime" as used herein means a coefficient (time to give 1/e) at the time when:
(1) light (excitation light) having a wavelength of 320 nm is irradiated to a sample,
(2) after irradiation of the excitation light is blocked, afterglow having a wavelength of 430 nm is measured under the conditions of a measurement interval of 0.01 second until the afterglow intensity reaches 0.01% or less of the emission intensity during irradiation of the excitation light, and
(3) the relationship between the time thus obtained and the afterglow intensity is exponentially fitted.

[1.5. Emission Efficiency]

The light emitting body according to the present embodiment shows emission efficiency of 1% or greater. When the average thickness, average size, nitrogen content, or the like of the base material is optimized, the resulting light emitting body has emission efficiency of 7% or greater, 10% or greater, 15% or greater, or 20% or greater.

The term "emission efficiency" as used herein means a ratio of the number of photons emitted as fluorescence to the number of photons absorbed.

[2. Light Emitting Body (2)]

The light emitting body according to a second embodiment of the invention is characterized in that:

(a) it is equipped with a base material containing a graphene structure and a covering material, and (b) the graphene structure is equipped with a sheet portion and a terminal six-membered ring.

The graphene structure may contain nitrogen further. In this case, the graphene structure contains nitrogen preferably at least in a bound form (a nitrogen-containing functional group is bound to the carbon atom constituting the graphene structure).

[2.1. Base Material]

In the present embodiment, the term "base material" means a material containing a graphene structure. The base material may be composed only of a nitrogen-free graphene structure (graphene structure in the narrow sense) or may be composed of a graphene structure containing nitrogen (nitrogen-containing graphene structure). The base material may be composed only of one kind of graphene structures which are almost the same in forms (for example, the number of stacked layers of sheet, or size of sheet) or nitrogen content or may be a mixture of two or more graphene structures different in the form and/or nitrogen content.

[2.1.1. Graphene Structure]

In the present embodiment, the term "graphene structure" means a structure comprised of a monolayer or multilayer graphene nanosheet and equipped with a sheet portion and a terminal six-membered ring. The graphene structure may be equipped further with a nitrogen-containing functional group (nitrogen-containing graphene structure).

In the present embodiment, the term "graphene nanosheet" means a two-dimensional sheet-like structure comprised of a carbon ring structure and an $sp^2$ bonded aromatic ring. The graphene nanosheet may contain less than 0.5 wt % nitrogen as an unavoidable impurity (graphene nanosheet in the narrow sense) or may contain 0.5 wt % or more nitrogen (nitrogen-containing graphene nanosheet).

In order to exhibit PL characteristics, the graphene nanosheet is presumed to have, in an insulating matrix ($sp^3$ matrix) comprised of carbon atoms having an $sp^3$ hybrid orbital, a structure in which fine clusters ($sp^2$ clusters) made of carbon atoms having an $sp^2$ hybrid orbital have been embedded. In other words, in the graphene nanosheet exhibiting PL characteristics, $sp^2$ clusters are presumed to function as an emission center.

[2.1.1.1. Sheet Portion]

Figure 1:
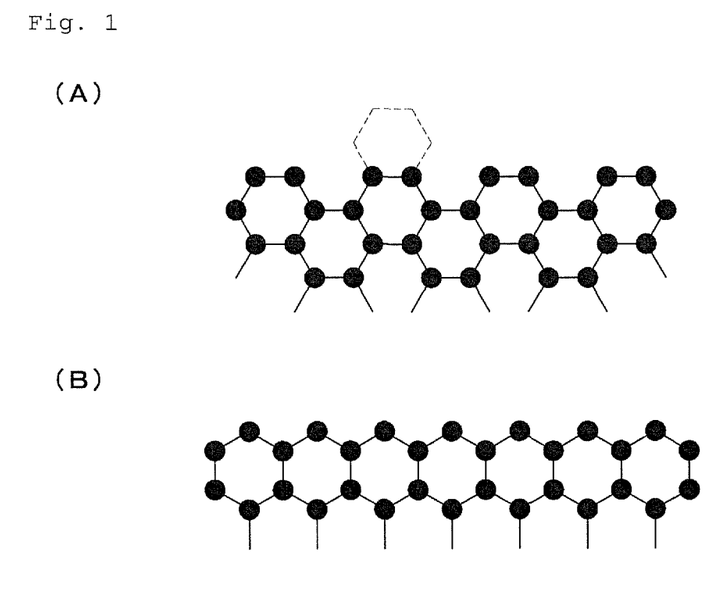
FIG. 1A is a schematic view of an armchair edge-face structure and FIG. 1B is a schematic view of a zigzag edge-face structure.

In the present embodiment, the term "sheet portion" means a portion comprised of a monolayer or multilayer graphene nanosheet and having, at the edge portion of the sheet, an armchair edge-face portion (refer to FIG. 1A). The edge portion of the sheet portion is desirably made only of this armchair edge-face portion, but may partially include a zigzag edge-face portion (refer to FIG. 1B).

In the present embodiment, the term "sheet portion" does not include, among six-membered rings constituting the graphene nanosheet, a terminal six-membered ring (indicated by a broken line in FIG. 1A) bound to the armchair edge-face portion via one side.

The sheet portion may be comprised of a monolayer graphene nanosheet or a multilayer graphene nanosheet.

[2.1.1.2. Terminal Six-Membered Ring]

In the present embodiment, the term "terminal six-membered ring" as used herein means a carbon six-membered ring bound to the armchair edge-face portion of the sheet portion while sharing only one side therewith.

FIG. 1A shows a terminal six-membered ring bound to an armchair edge-face portion. In FIG. 1A, the sheet portion is indicated by a solid line while the terminal six-membered ring is indicated by a broken line. To achieve high emission characteristics, the number of the terminal six-membered rings included in one sheet portion is preferably large.

[2.1.2. Nitrogen-Containing Functional Group]

In the present embodiment, the term "nitrogen-containing graphene structure" means a structure obtained by intentionally introducing nitrogen into a graphene structure in the narrow sense which is equipped with a sheet portion and a terminal six-membered ring and having a nitrogen content of 0.5 wt % or greater.

As described above, the term "introducing nitrogen" means:

(1) substituting some of the carbon atoms constituting the graphene nanosheet with nitrogen;

(2) bonding a nitrogen-containing functional group to the edge (including the atom on the side which is shared with the terminal six-membered ring) and/or basal plane of the graphene nanosheet; or (3) adsorbing a nitrogen-containing compound to the surface of the graphene nanosheet or between two nanosheets.

The nitrogen-containing graphene structure according to the present embodiment is characterized in that nitrogen has been introduced into the graphene structure at least in a bound form (the nitrogen-containing functional group is bound to the carbon atom constituting the graphene structure). The nitrogen-containing graphene structure may further contain nitrogen introduced in the form of substitution or adsorption.

When the base material contains a nitrogen-containing graphene structure, the nitrogen-containing graphene structure has a nitrogen-containing functional group bound to any one or more carbon atoms selected from:

(a) carbon atoms constituting the terminal six-membered ring but not bound to the armchair edge-face portion; and (b) carbon atoms constituting the sheet portion (including the carbon atom on the side shared with the terminal six-membered ring).

In the present embodiment, the term "nitrogen-containing functional group" means a functional group containing nitrogen as a constituting element. Examples of the nitrogen-containing functional group include amino group, imino group, N-oxide group, N-hydroxy group, hydrazine group, nitro group, nitroso group, azo group, diazo group, and azide group.

Any one of these nitrogen-containing functional groups may be bound to the terminal six-membered ring or sheet portion or any two or more of them may be bound thereto. When the nitrogen-containing functional group is bound to the terminal six-membered ring, the nitrogen-containing functional group may be bound to a portion of the terminal six-membered ring or the nitrogen-containing functional group may be bound to all the terminal six-membered rings.

[2.1.3. Nitrogen Content]

The nitrogen content in the graphene structure has an influence on the emission efficiency and emission wavelength. In general, with an increase in the nitrogen content, a change in emission wavelength increases. In order to achieve such an effect, the nitrogen content is preferably 0.5 wt % or greater. The nitrogen content is more preferably 1 wt % or greater, still more preferably 2 wt % or greater, still more preferably 5 wt % or greater.

On the other hand, when the nitrogen content increases excessively, the electron state undergoes a drastic change and PL characteristics cannot be achieved. The nitrogen content is therefore preferably 50 wt % or less. The nitrogen content is more preferably 40 wt % or less, still more preferably 30 wt % or less, still more preferably 20 wt % or less, still more preferably 10 wt % or less.

[2.1.4. Average Mass]

The average mass of the graphene structure has an influence on the emission efficiency and the emission wavelength.

The term "average mass" as used herein means an average value of the mass of the graphene structure per unit charge available by measuring the mass spectrum. The average mass and the size of the graphene structure have a mutual relationship and the smaller the average mass, the smaller the size of the graphene structure.

In general, with a decrease in size of the graphene structure, the emission wavelength becomes shorter due to a quantum size effect. In order to achieve light emission in a visible light range, the average mass of the graphene structure is preferably 500 m/z or greater. The average mass is more preferably 1000 m/z or greater.

On the other hand, when the graphene structure has an excessively large size, light emission does not occur in a visible light range or so-called "quenching", that is, reabsorption, to the sheet, of fluorescence emitted from the emission center occurs, leading to a decrease in emission efficiency. The average mass of the graphene structure is therefore preferably 50000 m/z or less. The average mass is more preferably 10000 m/z or less, still more preferably 5000 m/z or less, still more preferably 3000 m/z or less.

[2.1.5. Average Thickness]

The thickness of the graphene structure (that is, the number of stacked layers of the sheet portion) has an influence on the emission efficiency and emission wavelength.

Even if the sheet portion is made of a single layer, it functions as phosphor. The thickness of the monolayer graphene nanosheet is about 0.3 nm, which means that the graphene structure may have at least an average thickness of 0.3 nm or greater.

With an increase in the thickness of the graphene structure, the emission wavelength becomes longer, which is presumed to occur because the $\pi$-$\pi^*$ energy gap decreases with an increase in the size of $sp^2$ clusters in the sheet stacking direction.

When the graphene structure becomes excessively thick, however, the electron structure approximates to that of the bulk, making it impossible to achieve efficient light emission. The average thickness of the graphene structure is therefore preferably 50 nm or less. The average thickness is more preferably 20 nm or less, still more preferably 10 nm or less, still more preferably 5 nm or less.

The term "average thickness of the graphene structures" means an average thickness of n pieces (n≥5) of the graphene structures selected at random.

Examples of a method for measuring the thickness include:
(1) a method of measuring the thickness of the sheet directly by using an atomic force microscope (AFM); and
(2) a method of determining the thickness while considering an ideal thickness (0.34 nm) corresponding to one layer from the layer number of the sheet observed from a transmission electron microscope (TEM) photograph. Almost the same measurement results can be obtained by using either method.

[2.1.6. Oxygen-Containing Functional Group]

The term "oxygen-containing functional group" means a functional group containing oxygen as a constituting element. The oxygen-containing functional group contains an oxygen atom so that it has a high electron withdrawing property. Examples of the oxygen-containing functional group include =O (quinone group).

It is known that the emission efficiency is reduced when the oxygen atom of an oxygen-containing functional group is directly bound to the carbon atom constituting the sheet portion or terminal six-membered ring. This will equally apply to the graphene structure of the present application. To achieve high emission efficiency, the amount of the oxygen-containing functional group is preferably smaller. More preferably, the graphene structure is free from the oxygen-containing functional group.

The term "free from the oxygen-containing functional group" means that a ratio of a peak area corresponding to C—O relative to the whole peak area is 1% or less when peak separation of XPS (X-ray photoelectron spectroscopy) C is spectrum is conducted.

[2.2. Covering Material]

The surface of the base material has been covered with a covering material. The covering material may cover the whole surface of the base material or a part of the surface of the base material.

In the present embodiment, the term "covering material" means a compound having a polar group and at the same time, not having a π conjugated bond. The nitrogen-free graphene structure is hydrophilic and dispersible well in water. This will equally apply to a nitrogen-containing graphene structure having a proper nitrogen content. Since the covering material having a polar group and the hydrophilic sheet have affinity with each other, they are easily bound to each other to form a composite when mixed in a polar solvent.

No particular limitation is imposed on the molecular weight of the covering material. The covering material may be any of a low molecular weight compound having a molecular weight less than 1000, an oligomer having a molecular weight of 1000 or greater but less than 10000, or a polymer having a molecular weight of 10000 or greater.

Specific examples of the covering material include:
(1) ε-caprolactam;
(2) polyacrylic acid resins, cellulose-based resins, polyvinyl resins, polyurethane resins, methacrylic resins, polyester resins, silicone resins, polyethylene glycol, polyimide resins, polycarbonate, polyethylene oxide, and polyamide resins; and
(3) silane and silane compounds.

These covering materials may be used either singly or in combination.

[2.3. Amount of Covering Material]

The amount of the covering material has an influence on the emission lifetime.

In general, with an increase in the amount of the covering material, the emission lifetime extends. On the other hand, covering with an excess amount of the covering material does not bring practical benefit because its effect is saturated. The optimum amount of the covering material is selected, depending on the kind of the base material and the kind of the covering material. The amount of the covering material is typically from 0.01 to 99.9 wt %.

[2.4. Emission Lifetime]

The light emitting body according to the present embodiment has a longer emission lifetime than a phosphor using a conventional graphene as a base. The light emitting body having an optimized average thickness, average size, nitrogen content, or the like has an emission lifetime of 10 ns or greater or 100 ns or greater.

The term "emission lifetime" as used herein means a coefficient (time to give 1/e) at the time when:

(1) light (excitation light) having a wavelength of 320 nm is irradiated to a sample;

(2) after irradiation of the excitation light is blocked, afterglow having a wavelength of 430 nm is measured under the conditions of a measurement interval of 0.01 second until the afterglow intensity reaches 0.01% or less of the emission intensity during irradiation of the excitation light; and (3) the relationship between the time thus obtained and the afterglow intensity is exponentially fitted.

[2.5. Emission Efficiency]

The light emitting body according to the present embodiment shows emission efficiency of 1% or greater. When the average thickness (the number of stacked layers of the sheet portion), average size, nitrogen content, or the like of the base material is optimized, the resulting light emitting body has emission efficiency of 7% or greater, 10% or greater, 15% or greater, or 20% or greater.

The term "emission efficiency" as used herein means a ratio of the number of photons emitted as fluorescence to the number of photons absorbed.

[3. Process for Preparing a Nitrogen-Containing Graphene Structure]

A graphene structure containing nitrogen in at least a predetermined amount (nitrogen-containing graphene structure) can be prepared in the following manner.

Described specifically, the process for preparing a nitrogen-containing graphene structure includes:

a dispersing step, that is, a step of dispersing graphite oxide or graphene oxide in an aqueous solution having a nitrogen-containing compound dissolved therein; and a heating step, that is, a step of heating the resulting aqueous solution at 60° C. or greater.

[3.1. Dispersing Step]

[3.1.1. Nitrogen-Containing Compound]

The term "nitrogen-containing compound" means a compound containing nitrogen as a constituting element and soluble or dispersible in water.

Examples of the nitrogen-containing compound include:

(1) urea, ammonia, thiourea, hydrazine, nitrate esters, sodium nitrate, sodium nitrite, hydroxylamine, pyridine N-oxide, N-hydroxylalkyleneimine, sodium azide, sodium amide, and carboxylic acid azide;

(2) alkylamines such as methylamine, ethylamine, n-propylamine, isopropylamine, n-butylamine, tert-butylamine, n-pentylamine, and n-hexylamine, and halates thereof; and (3) diamines such as ethylenediamine and propanediamine.

As the starting raw material, any one of these nitrogen-containing compounds may be used or two or more of them may be used in combination.

Of these, urea is particularly suited as the nitrogen-containing compound, because it tends to form a peptide bond with the oxygen-containing functional group in the graphite oxide or graphene oxide and has high reactivity. Ammonia is also suited as the nitrogen-containing compound because it tends to form an amino group due to a nucleophilic reaction with the oxygen-containing functional group in the graphite oxide or graphene oxide.

The nitrogen-containing compound is dissolved or dispersed in water and used as the aqueous solution thus obtained. The concentration of the nitrogen-containing compound contained in the aqueous solution is not particularly limited and the optimum concentration may be selected, depending on the kind of the starting raw material or required properties. The concentration of the nitrogen-containing compound is typically from 0.1 to 10 mol/L.

[3.1.2. Graphite Oxide and Graphene Oxide]

The term "graphite oxide" means a compound in which an oxygen-containing functional group (for example, —COOH group, —OH group, or —O—O—C— group) has been bound onto the edge and/or basal plane of the graphene layer constituting the graphite. Graphite oxide can be obtained, for example, by oxidizing graphite with an oxidizing agent (potassium permanganate, potassium nitrate, or the like) in a strong acid (concentrated sulfuric acid).

The term "graphene oxide" means a sheet-like substance available by delamination of graphite oxide. The graphene oxide can be obtained, for example, by dispersing graphite oxide in an aqueous solution and then exposing the resulting dispersion to ultrasonic waves.

In the invention, either one or both of graphite oxide before delamination or graphene oxide obtained by delamination may be used.

The graphite oxide and/or graphene oxide is added to the aqueous solution containing the nitrogen-containing compound. The amount of the graphite oxide and/or graphene oxide contained in the aqueous solution is not particularly limited and the optimum amount may be selected, depending on the kind of the starting raw material or required properties. The amount of graphite oxide and/or graphene oxide is typically from 0.1 to 50 g/L.

[3.2. Heating Step]

After graphite oxide and/or graphene oxide is dispersed in the aqueous solution having a nitrogen-containing compound dispersed therein, the resulting aqueous solution is heated. Heating is conducted in order to increase a reaction rate. When the heating temperature exceeds the boiling point of the aqueous solution, the heating is conducted in a hermetically sealed container.

When the heating temperature is too low, the reaction does not proceed sufficiently within a realistic time. Accordingly, the heating temperature is required to be 60° C. or greater. The heating temperature is more preferably 70° C. or greater, still more preferably 80° C. or greater.

When the heating temperature is too high, on the other hand, there is a possibility of nitrogen incorporated by substitution or bonding being disconnected. In addition, an expensive pressure-resistant container becomes necessary, which increases a manufacturing cost. The heating temperature is therefore preferably 260° C. or less. The heating temperature is more preferably 240° C. or less, still more preferably 220° C. or less, still more preferably 200° C. or less, still more preferably 180° C. or less, still more preferably 160° C. or less.

As the heating time, the optimum time is selected, depending on the heating temperature. In general, with an increase in the heating temperature, the reaction can be caused to proceed in a short time. The heating time is typically from 1 to 20 hours.

The nitrogen content, average thickness, and average size of the nitrogen-containing graphene structure can be controlled by optimizing the heating conditions. In general, with an increase in the heating temperature and/or with an increase in the heating time, the nitrogen content decreases, the average thickness decreases, or the average size decreases.

The nitrogen-containing graphene structure thus obtained may be used as it is for various applications or may be washed, filtered, and/or dialyzed as needed.

[4. Process for Preparing a Nitrogen-Free Graphene Structure]

The graphene structure containing nitrogen in an amount not greater than a predetermined amount (graphene structure in the narrow sense) can be prepared in a similar manner to that employed for the preparation of a nitrogen-containing graphene structure except for the use of water instead of an aqueous solution having a nitrogen-containing compound dissolved therein.

In this case, a graphene structure containing a large amount of a terminal six-membered ring can be obtained by heating under the conditions of a hydrogen ion exponent of 8 or greater.

[5. Process for Preparing a Light Emitting Body]

The light emitting body according to the invention can be prepared by dispersing or dissolving the base material and the covering material in a polar solvent and then evaporating the polar solvent.

As the polar solvent, those capable of dispersing or dissolving the base material and the covering material therein can be used. Specific examples of the polar solvent include water, ethanol, methanol, butanol, and acetone. Evaporation conditions of the polar solvent are not particularly limited and the optimum conditions may be selected depending on the kind of the polar solvent.

[6. Effect of the Light Emitting Body]

Non-patent Documents 1 to 3 describe phosphors using, as a base, a graphene synthesized by various processes. As described in Non-patent Document 3, however, conventional phosphors have a very short emission lifetime. In addition, conventional phosphors have low emission efficiency.

On the other hand, the emission lifetime shows a marked increase when a base material containing a graphene structure is covered with a covering material, which is presumed to occur because of the following reasons:

(1) when the surface of a base material is covered with a covering material having polarity, rotational motion or vibrational motion of the functional group in the covering material enhances the spin-orbit interaction of the graphene structure, resulting in occurrence of intersystem crossing to a triplet state and elongation of the relaxation time of excited electrons.

(2) when the surface of a base material is covered with a covering material having polarity, a hydrogen bond is formed between the covering material and the base material. This hydrogen bond suppresses quenching due to a reaction between a triplet state of the graphene structure and dissolved oxygen, leading to elongation of an emission lifetime.

Moreover, nitrogen introduced into the graphene structure enhances the emission efficiency further, which is presumed to occur because of the following reason.

Described specifically, by dispersing graphite oxide and/or graphene oxide in water and heating the resulting dispersion at a predetermined temperature, delamination of graphite oxide and reduction in size, into a nanosize, of sheet-like graphene oxide obtained by delamination occur. At the same time, a reduction reaction of the oxygen-containing functional group (for example, an epoxide group) bound to the graphite oxide or graphene oxide occurs, leading to an increase in the concentration of $sp^2$ clusters serving as an emission center.

At this time, a nitrogen-containing compound added to the aqueous solution causes reduction of the oxygen-containing functional group bound to the graphite oxide or graphene oxide and at the same time, causes substitution, bonding, and/or adsorption of nitrogen.

Alternatively, a terminal six-membered ring is formed simultaneously with the reduction of the oxygen-containing functional group and bonding of the nitrogen-containing functional group to the terminal six-membered ring or sheet portion occurs. In addition, substitution or adsorption of nitrogen occurs.

As a result, the graphene structure obtained by adding the nitrogen-containing compound has high emission efficiency compared with the graphene structure obtained without adding the nitrogen-containing compound. In addition, by controlling the nitrogen content, thickness of the sheet, the number of stacked layers of the sheet, and the like, the emission wavelength can be controlled relatively easily.

The emission efficiency can be enhanced by the introduction of nitrogen presumably because:

(1) non-radiative recombination is suppressed by the nitrogen-containing functional group introduced into the terminal six-membered ring;

(2) the structure has a small particle-size distribution and does not have an oxygen-containing functional group (for example, a quinone group) having a high electron withdrawing property;

(3) due to the substitution of carbon in the $sp^2$ matrix with nitrogen, the substituted region becomes an emission center analogous to $sp^2$ clusters and the concentration of emission centers increases; or (4) the nitrogen-containing functional group is bound to the carbon in the $sp^3$ matrix and the bound region becomes an emission center analogous to the $sp^2$ cluster region, leading to an increase in the concentration of emission centers.

A change in emission wavelength occurs due to the introduction of nitrogen, presumably because:

(1) the nitrogen-containing functional group is introduced into the terminal six-membered ring;

(2) the carbon atom in $sp^2$ clusters is substituted with nitrogen, (3) the nitrogen-containing functional group is bound to the carbon atom in the $sp^3$ matrix; or (4) the nitrogen-containing compound adsorbs to the vicinity of $sp^2$ clusters so that electronic energy transfer occurs from a $\pi^*$ excited state which is an electron excited state of carbon to a lower $n^*$ excited state of nitrogen.

The light emitting body according to the invention has high fluorescence efficiency so that it can be used for LED, display, and the like. In addition, the light emitting body according to the invention has a long emission lifetime so that it can be used for a high-sensitivity biological substance fluorescent labeling agent for detecting a specific biological substance in the living body.

EXAMPLES

Example 1

1. Preparation of Phosphor Dispersion

Graphite oxide (0.1 g) was dispersed in 5 mL of a 0.2 mol/l aqueous urea solution. The aqueous solution thus obtained was heated at 150° C. for 10 hours in a hermetically sealed container. After heating, the solution was washed sufficiently to separate a nitrogen-containing graphene structure.

Next, 10 mg of polyacrylic acid (covering material) was dissolved in 5 mL of an aqueous dispersion having 0.1 mg of the nitrogen-containing graphene structure dispersed therein.

The solution thus obtained was dried to yield a nitrogen-containing graphene structure/polyacrylic acid composite.

2. Test Method

[2.1. Emission Spectrum]

Emission spectrum of a light emitting body was measured using a spectrofluorometer ("FP-6500", trade name; product of JASCO).

[2.2. Emission Efficiency]

Emission efficiency was measured using an absolute photo-luminescence quantum yield measurement system ("C9920-02", trade name; product of Hamamatsu Photonics).

[2.3. Emission Lifetime]

Emission lifetime was measured at room temperature by using a spectrofluorometer ("FP-6500", trade name; product of JASCO).

3. Results

Figure 2:
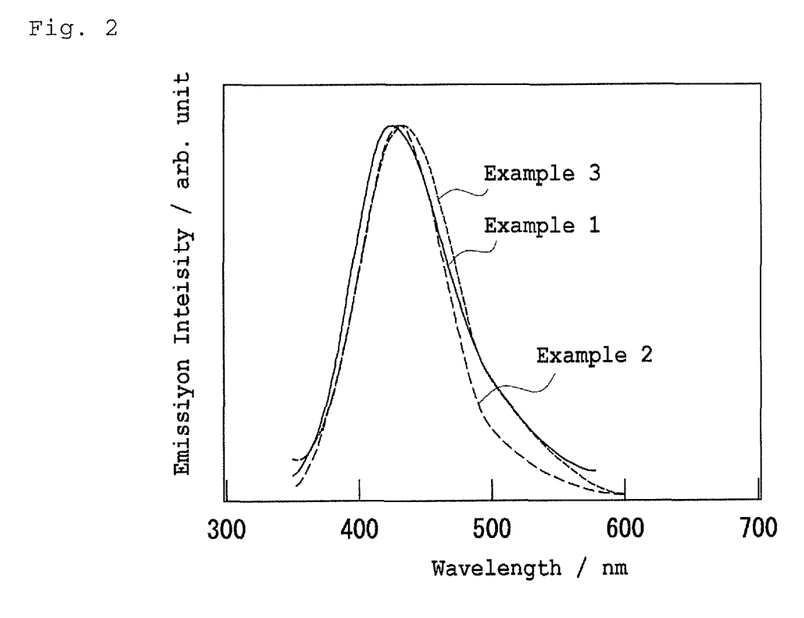
FIG. 2 is a fluorescence spectrum of each of the nitrogen-containing graphene structure/polymer composites obtained in Examples 1 to 3.
Figure 3:
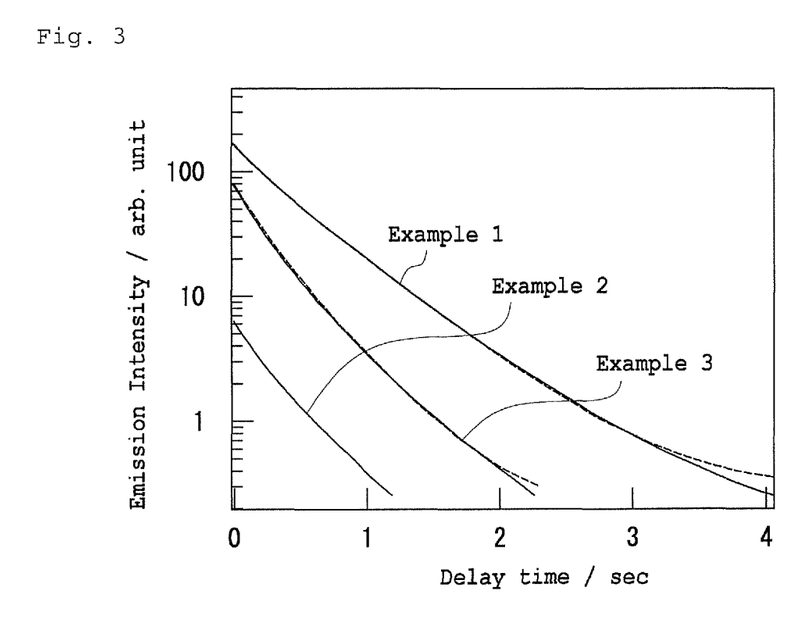
FIG. 3 shows an emission intensity of each of the nitrogen-containing graphene structure/polymer composites obtained in Examples 1 to 3 after excited light is blocked.

FIG. 2 shows an emission spectrum of the light emitting body obtained in Example 1. In Example 1, the peak position of the spectrum was 424 nm and the half width of the peak was 90 nm. The light emitting body obtained in Example 1 had emission efficiency of 22%, much higher than that obtained in Non-patent Document 1 (Table 1). Moreover, FIG. 3 shows an emission lifetime of the light emitting body obtained in Example 1. The light emitting body obtained in Example 1 had an emission lifetime of 0.54 sec (Table 1), revealing that it had a very long emission lifetime.

Example 2

1. Preparation of Sample

In a similar manner to Example 1 except for the use of carboxymethyl cellulose as the covering material, a nitrogen-containing graphene structure/carboxymethyl cellulose composite was obtained.

2. Test Method

Under similar conditions to those in Example 1, emission spectrum, emission efficiency, and emission lifetime were measured.

3. Results

Results are shown in FIG. 2, FIG. 3, and Table 1. The light emitting body obtained in Example 2 had a peak position of the spectrum at 433 nm and the half width of the peak was 90 nm. In addition, the light emitting body had emission efficiency of 21%, which was markedly higher compared with Non-patent Document 1. It had an emission lifetime of 0.47 second, revealing that it had a very long emission lifetime.

Example 3

1. Preparation of Sample

In a similar manner to Example 1 except for the use of polyvinyl alcohol as the covering material, a nitrogen-containing graphene structure/polyvinyl alcohol composite was obtained.

2. Test Method

Under similar conditions to Example 1, emission spectrum, emission efficiency, and emission lifetime were measured.

3. Results

The results are shown in FIG. 2, FIG. 3, and Table 1. The light emitting body obtained in Example 3 had a peak position of the spectrum at 430 nm and the half width of the peak was 78 nm. In addition, it had emission efficiency of 23%, which was markedly higher compared with Non-patent Document 1. It had an emission lifetime of 0.38 second, revealing that it had a very long emission lifetime.

Comparative Example 1

1. Preparation of Sample

The nitrogen-containing graphene structure obtained in Example 1 was provided for the test as it was.

2. Test Method

Under similar conditions to Example 1, emission spectrum, emission efficiency, and emission lifetime were measured.

3. Results

The results are shown in Table 1. The light emitting body obtained in Comparative Example 1 had a peak position of the spectrum at 430 nm and the half width of the peak was 67 nm. The emission efficiency was 24%. It has, however, been found that the emission lifetime was not greater than the lower limit of analysis (0.01 sec) of the measurement system.

TABLE 1

| No. | Emission Wavelength nm | Half Width nm | Emission Efficiency % | Emission Lifetime sec |
|---|---|---|---|---|
| Example 1 | 424 | 90 | 22 | 0.54 |
| Example 2 | 433 | 90 | 21 | 0.47 |
| Example 3 | 430 | 78 | 23 | 0.38 |
| Comparative Example 1 | 430 | 67 | 24 | — |

The embodiments of the invention were so far described specifically. The invention is, however, not limited to or by these embodiments and can be changed without departing from the gist of the invention.

The light emitting body according to the invention can be used for a probe for detecting a biochemical reaction, a light emitting device, LED, display, fluorescent tag, and the like.

What is claimed is:
1. A light emitting body comprising:
a base material containing a graphene structure; and
a covering material for covering a surface of the base material,
wherein:
the graphene structure comprises:
a sheet portion made of a monolayer or multilayer graphene nanosheet and having, at the edge portion thereof, an armchair edge-face portion;

a terminal six-membered ring bound to the armchair edge-face portion while sharing only one side therewith; and a nitrogen-containing functional group bound to any one or more carbon atoms selected from:
  (a) carbon atoms constituting the terminal six-membered ring but not bound to the armchair edge-face portion, and
  (b) carbon atoms constituting the sheet portion including carbon atom on the side shared with the terminal six-membered ring;

the graphene structure has an average mass of 1000 m/z to 50000 m/z;

the graphene structure has a nitrogen content of 5 wt % to 50 wt %;

the graphene structure is obtained by dispersing graphite oxide and/or graphene oxide in an aqueous solution having urea and/or ammonia dissolved therein and heating the resulting aqueous solution at 60° C. or greater; and the light emitting body has an emission efficiency of 15% or greater.

2. The light emitting body according to claim 1, wherein the covering material is composed of at least one selected from the group consisting of polyacrylic acid, carboxymethyl cellulose, and polyvinyl alcohol.

3. The light emitting body according to claim 1, wherein the base material has an average thickness of 0.3 nm or greater but not greater than 50 nm and an average size of 1 nm or greater but not greater than 1000 nm.

4. The light emitting body according to claim 3, wherein the covering material is composed of at least one selected from the group consisting of polyacrylic acid, carboxymethyl cellulose, and polyvinyl alcohol.

5. The light emitting body according to claim 1, wherein the covering material is a compound comprising a polar group and at the same time not comprising a π conjugated bond.

* * * * *